United States Patent [19]
Hunter et al.

[11] Patent Number: 5,694,412
[45] Date of Patent: Dec. 2, 1997

[54] EPITAXIAL VISIBLE-LIGHT-EMITTING DEVICES WITH LIGHT EXTRACTED THROUGH THE SUBSTRATE AND METHOD OF MAKING SAME

[75] Inventors: Andrew T. Hunter, Woodland Hills; Jennifer J. Zinck, Calabasas; K. C. Fuller, Los Angeles; K. W. Kirby, Calabasas, all of Calif.

[73] Assignee: HE Holdings Inc., Los Angeles, Calif.

[21] Appl. No.: 629,123

[22] Filed: Apr. 8, 1996

[51] Int. Cl.$^6$ .............................. H01S 3/08; H01L 29/06; H01L 21/20
[52] U.S. Cl. .............................. 372/96; 372/43; 372/98; 372/99; 257/14; 437/51; 437/129
[58] Field of Search .................. 372/21, 7, 39, 372/43, 50, 92, 96, 98, 99, 108; 257/14, 15; 437/51, 129, 130, 134

[56] References Cited

U.S. PATENT DOCUMENTS

| | | | |
|---|---|---|---|
| 4,539,687 | 9/1985 | Gordon et al. | 372/24 |
| 4,821,282 | 4/1989 | Podgorski | 372/99 |
| 4,999,842 | 3/1991 | Huang et al. | 372/45 |
| 5,012,486 | 4/1991 | Luryi et al. | 372/45 |
| 5,136,345 | 8/1992 | Kasahara | 372/99 X |
| 5,138,628 | 8/1992 | Pocholle et al. | 372/99 |
| 5,257,140 | 10/1993 | Rogers | 372/99 X |
| 5,324,964 | 6/1994 | Ackley et al. | 257/98 |
| 5,351,256 | 9/1994 | Schneider | 372/45 |
| 5,416,583 | 5/1995 | Sanzari | 372/99 X |
| 5,528,616 | 6/1996 | Kash et al. | 375/45 |

OTHER PUBLICATIONS

Petruzzello et al., "Improvement In Lasing Characteristics Of II–VI Blue–green Lasers Using Quaternary And Ternary Alloys To Produce Pseudomorphic Heterostructures," *J. of Crystal Growth*, vol. 138, pp. 686–691 (1994).

Levy et al., "Laser Cathode Ray Tube with a Semiconductor Double–Heterostructure Screen," *IEEE Electron Device Letters*, vol. EDL-4, No. 5, pp. 155–156 (1983).

Kosaka et al., "Uniform Characteristics with Low Threshold and High Efficiency for a Single–Transferse–Mode Vertical–Cavity Surface–Emitting Laser–Type Device Array," *IEEE Photonics Technology Letters*, vol, 6, pp. 323–325 (1994).

Primary Examiner—Brian Healy
Attorney, Agent, or Firm—V. D. Duraiswamy; W. K. Denson-Low

[57] ABSTRACT

An epitaxial structure suitable for use in a light-emitting device having at least one operating frequency in the visible range, and a method for providing the same. The epitaxial structure includes a semiconductor substrate which is transparent at the operating frequency, an output mirror lattice-matched to the substrate and comprising at least one pair of semiconductor layers having substantially different refractive indices and an active region lattice-matched to the substrate and having a bandgap narrower than the bandgap of the output mirror.

20 Claims, 3 Drawing Sheets

EPITAXIAL VISIBLE-LIGHT-EMITTING DEVICES WITH LIGHT EXTRACTED THROUGH THE SUBSTRATE AND METHOD OF MAKING SAME

BACKGROUND OF THE INVENTION

1. Field of the Invention

The present invention relates to semiconductor emitter devices. More particularly, the present invention relates to an epitaxial structure suitable as a target screen or light emitter in a laser device pumped by an electron beam.

2. Description of the Related Art

Electron beam ("e-beam") pumped semiconductor lasers are generally of two types: transverse lasers in which the directions of the e-beam and light beam are orthogonal to one another, and longitudinal lasers in which the directions of the e-beam and light beam are essentially parallel to one another.

The industry has attempted to develop efficient and high-performance longitudinal lasers. However, available technologies for epitaxial deposition of light emitters suffers from the disadvantage that there is no practical substrate that can be used that allows lattice-matched deposition on a material that transmits blue light.

Previous implementations of epitaxially-grown laser CRTs were made using III–V's on GaAs. Neither this previous approach, nor any As or P based III–V approach provides blue or green laser emission, and the most common substrate used for red light emitters is GaAs, which is opaque throughout the visible wavelength. Thus, only transverse lasers can be manufactured using this material system. The two most successful approaches to date for blue and blue green emitters also suffer from this disadvantage. Blue and blue green light emitters have been fabricated using ZnMgSSe quaternary alloys grown lattice matched to GaAs or ZnSe.

For example, Petruzzello et al. discuss an example of ZnMgSSe-based laser structures grown on GaAs. Petruzzello et al., "Improvement In Lasing Characteristics Of II–VI Blue-green Lasers Using Quaternary And Ternary Alloys To Produce Pseudomorphic Heterostructures," *J. of Crystal Growth*, vol 138, pp. 686–691 (1994). Petruzzello et al. recognize the importance of lattice matching. Similarly, other efforts developed essentially the same laser structure as that disclosed by Petrozzello et al. on ZnSe substrates. However, GaAs is opaque throughout the visible, and ZnSe does not transmit blue at a short enough wavelength for the optimum blue for a full color display. Thus, the technology discussed in Petrozzello et al. is appropriate for transverse lasers but not for longitudinal lasers.

Gordon et al. concerned a method for making a near infrared longitudinal laser emitter on GaAs substrate. Gordon et al., "Laser Cathode Ray Tube with a Semiconductor Double-Heterostructure Screen," *IEEE Electron Device Letters*, vol. EDL-4, No. 5, pp. 155–156 (1983); Gordon et al., U.S. Pat. No. 4,539,687. However, this technique requires the selective etching of the substrate from the laser after growth, since the substrate is opaque to the laser light.

Kosada et al. gives an example of a near infrared longitudinal laser emitter designed to emit a wavelength sufficiently long that it is not absorbed by the GaAs substrate. Kosada et al., "Uniform Characteristics with Low Threshold and High Efficiency for a Single-Transferse-Mode Vertical-Cavity Surface-Emitting Laser-Type Device Array," *IEEE Photonics Technology Letters*, vol. 6, pp. 323–325 (1994). However, a similar device containing a combination of substrate and laser to allow this to occur with visible range has not been available.

A second approach has been to use compounds from the AlGaInN system grown on sapphire. While a sapphire substrate is transparent throughout the visible, the material system is far from lattice matched and the resulting films have high defect densities. To date, no injection lasers have been fabricated from the nitride system, probably as a consequence of these high defect densities.

SUMMARY OF THE INVENTION

The present invention provides an epitaxial structure suitable for use in a light-emitting device operating in the visible wavelength comprising a substrate which is transparent at the operating frequencies of the device, an output mirror having a plurality of layers, and at least one active layer. In accordance with a preferred embodiment of the invention the output mirror contains at least one pair of semiconductor layers made of semiconductor materials having substantially different refractive indices. In addition, each of the active layers are made of semiconductor materials having a bandgap narrower than the semiconductor materials in the output mirror. Moreover, the semiconductor materials making up the active region and the output mirror are substantially lattice matched to the substrate.

The present invention also relates a method of making the epitaxial structure suitable for use in a light-emitting device. In a preferred embodiment of the invention, the substrate made of $SrF_2$ is annealed in an HF/He atmosphere to a final anneal temperature between about 500° and about 1100° C. The method preferably provides the output mirror and active region over the substrate by an epitaxial deposition method.

The present invention further provides an epitaxial system over a transparent substrate in the visible including the blue and blue-green range. Thus, the present invention is suitable as a target for a high-performance longitudinal laser in the visible range.

In addition, this invention allows epitaxial deposition technology to be used to precisely tailor the properties of the optical emitter. Thickness can be more precisely controlled, particularly at the thickness values required to allow practical acceleration voltages to be used.

The invention itself, together with further objects and attendant advantages, will best be understood by reference to the following detailed description, taken in conjunction with the accompanying drawings.

DESCRIPTION OF THE PREFERRED EMBODIMENTS

Figure 1:
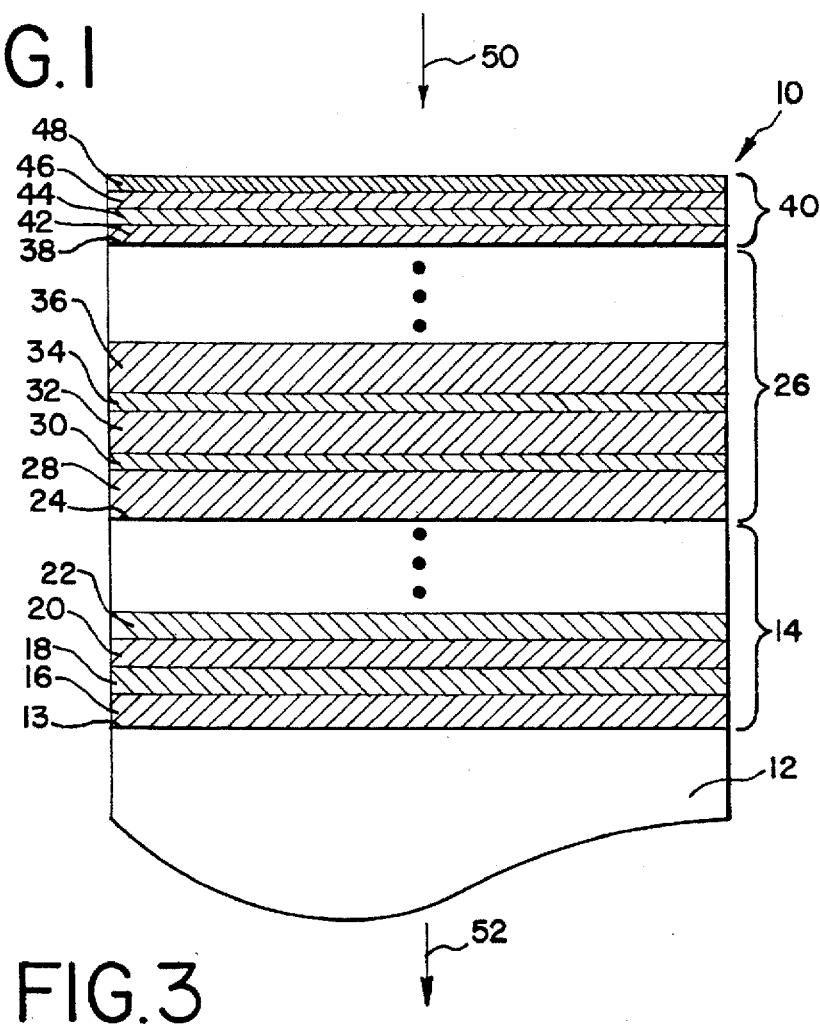
FIG. 1 is a schematic diagram of an epitaxial structure embodying the present invention.

With reference to FIG. 1, there is shown an epitaxial structure 10 embodying the present invention suitable as a target screen in an e-beam pumped semiconductor laser device (not shown). The base of the structure 10 is a semiconductor substrate 12. Mounted to the surface 13 of the substrate 12 is an output mirror 14. The output mirror 14 includes a plurality of pairs of semiconductor layers 16, 18 and 20, 22, such that the first semiconductor layer 16, 20 in each pair has a refractive index substantially different from that of the second semiconductor layer 18, 22 in each pair. An active region 26 is on the surface 24 of the output mirror 14. The active region 26 includes a plurality of quantum wells 30, 34 that are sandwiched between cladding layers 28, 32 and 36. An input mirror 40 is on the surface 38 of the active region 26. The input mirror 40 consists of a three dielectric layers 42, 44, 46 and one metallic layer 48. In FIG. 1, the dots denote that the layer sets immediately below them are repeated.

In operation, the e-beam 50 is focused and scanned across the epitaxial structure 10. A high positive potential is applied to the epitaxial structure 10 and causes the e-beam 50 to be attracted to and substantially transmitted through the input mirror 40 and absorbed in the active region 26 wherein it generates electron-hole pairs. When the electrons and holes recombine radiatively in the active region 26, they generate optical radiation which causes light emission with net gain through the output mirror 14, thereby producing a light beam 52 (emitted light) which emanates essentially perpendicular to the surface 13 of the substrate 12. Because the e-beam makes a nearly 90&20 angle to the surface 13 of the substrate 12, the e-beam 42 and the emitted light 52 can be thought of as being essentially parallel—a common assumption for longitudinal lasers. The emitted light 52 is scanned by scanning the e-beam 50.

In accordance with the present invention, the substrate 12 is transparent at the optical wavelength of the emitted light 44. In addition, the active region 26 and the output mirror 14 are lattice matched to the substrate 12.

In one embodiment of the present invention, the epitaxial structure 10 is suitable as a target in a laser device (not shown) which emits blue or blue-green light through the substrate 12. Preferably, the semiconductor substrate 12 includes $MF_2$, where M is selected from the group consisting of strontium (Sr), lead (Pb), calcium (Ca) and barium (Ba).

Conventional substrate orientations can be used in the present invention. For example, the cleavage plane of the cubic fluorides is the (111) which is a nonpolar surface having the lowest surface free energy of the low index planes. However, it is preferable to grow II–VI or III–V optoelectronic devices in the (001) orientation to avoid any complications from local fields arising from the known piezoelectricity of the (111) orientation of zincblende materials.

The output mirror 14, a partially reflecting dielectric mirror, is adjacent to the substrate 12. Preferably, a buffer layer consisting of epitaxial $MF_2$ (not shown) is deposited between the output mirror 14 and the substrate surface 13. A buffer layer provides for reliable adherence of the output mirror 14 to the substrate surface 13. Alloy layers which are grown without this intermediate buffer layer may delaminate from the substrate during thermal cycling. It should be understood that a buffer layer may also be used to prepare the substrate surface 13 for deposition of the output mirror 14.

The output mirror 14 is adjacent to the active layer 26. Preferably, to reduce dislocation or other crystal graphic defects in the epitaxial structure 10, the active layer 26 is preferably directly deposited on the surface 24 of the output mirror 14, employing neither buffer layer nor grading layer.

The output mirror 14 contains at least one pair of semiconductor layers having dissimilar refractive indices. For example, the first layer 16 may have a refractive index substantially greater than the refractive index of the adjacent second layer 18. The reflectivity of the output mirror 14 can be tuned by altering the number of semiconductor layers. The refractive indices alternate so that, for example, the first layer 20 of the second pair has a refractive index substantially greater than the refractive index of the adjacent second layers 18 and 22. The semiconductor layers 16 and 20 with the greater refractive index also have bandgaps large enough so that the light emitted by the laser is not absorbed by either of the first layers 16 and 20. The bandgap of the second layers 18, 22 is also large enough so that the light emitted by the lens laser is not absorbed by these layers. In a preferred embodiment of the present invention, the output mirror 14 is made of semiconductor materials which are lattice matched to the substrate, single crystal, and free of defects. The crystal quality of the output mirror 14 must be sufficiently high to allow growth of an active layer 26 with a carrier lifetime long enough to allow lasing.

The active region 26 is the region that emits light beam 44. The active region 26 shown in FIG. 1 contains a plurality of layers ("active layers"). The bandgap of the material in the quantum wells 30, 34 should be chosen such that when added to electron and hole confinement energies, the total will be equal to the desired emission energy of the laser. The material in the cladding layers 28, 32, 36 should have a band gap greater than the emission energy of the quantum wells 30, 34. It should be understood that the number of quantum wells is determined by the amount of gain required for lasing, and by constraints on total active layer thickness set by the penetration depth of the incoming e-beam 50 and by requirements for laser resonance. In a preferred embodiment, the quantum wells are placed at the antinodes of the optical standing wave inside the active region. Alternatively, the active region 26 could consist of a single material with a bandgap equal to the desired emission energy of the laser, and smaller than that of the semiconductor layers 16, 18, 20, and 22 in the output mirror 14. The thickness of this uniform layer is again determined by the penetration depth of the incoming e-beam 50, and by the laser resonance condition.

The composition of the layers making up the output mirror 14 and the active region 26 is selected to satisfy the bandgap and lattice-matching requirements described above. Preferably, the epitaxial structure 10 includes a material system selected from the group consisting of II–VI and III–V materials. Thus, the composition of the material system can be, for example, $(Zn_xCd_yMg_zHg_{1-x-y-z})(S_BSe_ATe_{1-A-B})$ or $(Al_mGa_nIn_{1-m-n})(P_KAs_{1-K})$. The invention takes advantage of the lattice match between certain classes of semiconductor alloys and several cubic, transparent fluoride crystals. This is schematically illustrated for a specific example in FIG. 2, which shows a plot the bandgap of the ternary alloys of II–VI semiconductors as a function of their lattice constant.

Figure 2:
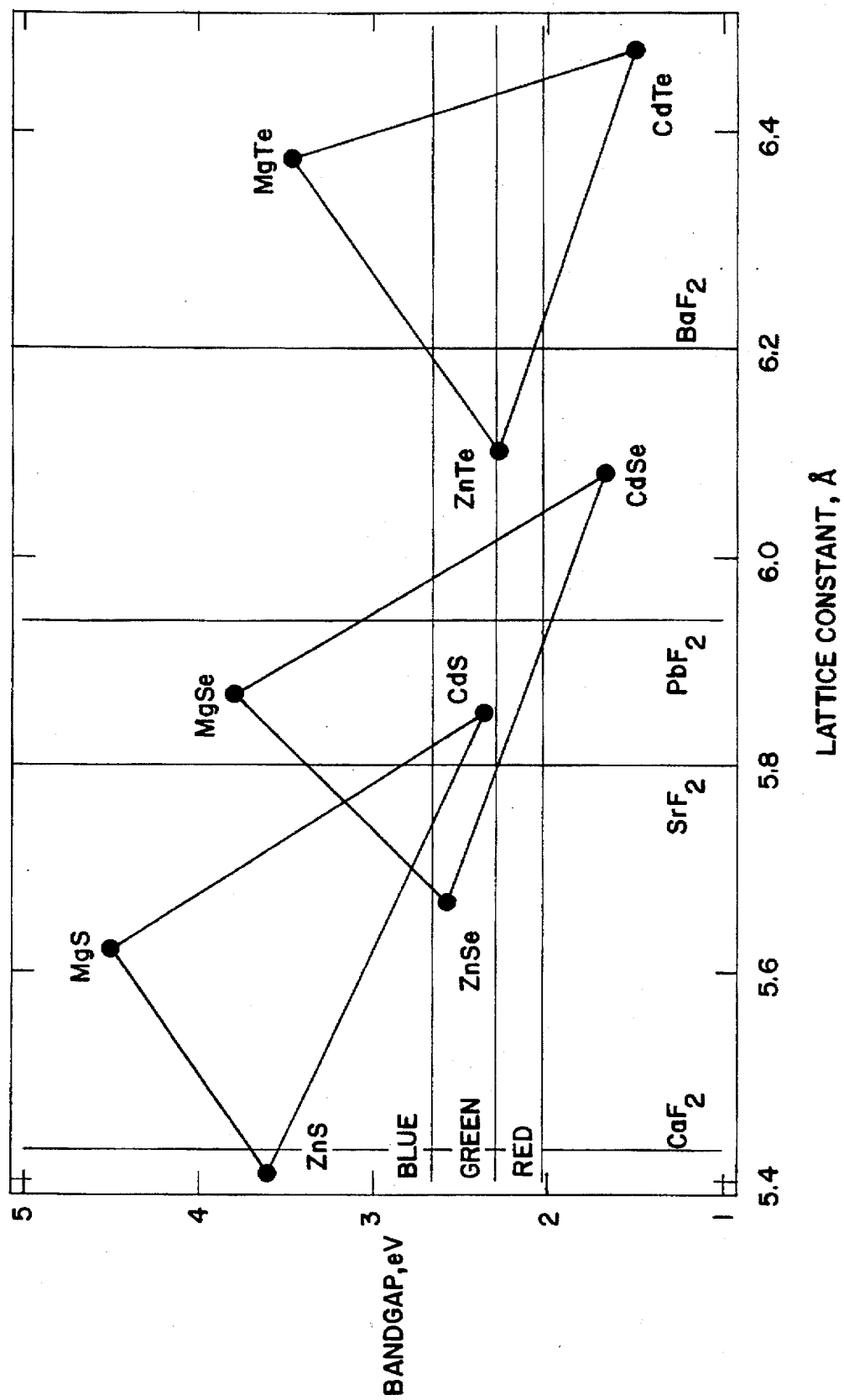
FIG. 2 is a graph plotting the approximate bandgap of the ternary alloys of II–VI semiconductors as a function of their lattice constant.

In FIG. 2, the labeled points on the diagram (for the center triangle) are for the binary compounds ZnSe, CdSe, and MgSe. The lines connecting the points show the approximate bandgap versus lattice constant curves for the ternary alloys made by mixing the binary compounds comprising the end points. For this diagram, the curves are drawn as straight lines. For many alloy systems of this type, the measured curves have some downward curvature. The shape will affect the actual values of alloy composition chosen to fabricate the device, but does not alter the general features of the design. The area enclosed by the three bounding curves represents the expected values of lattice constant and bandgap that can be achieved with a quaternary alloy formed by mixing the three binary compounds represented by the vertices of the boundary. Also shown in FIG. 2 is a straight vertical line indicating the lattice constant of $SrF_2$ and $PbF_2$, two wide bandgap cubic insulators. The segment of the line that overlaps the area of the quaternary alloy shows the range of band gaps of the quaternary that can be lattice matched to these transparent substrates.

Although only the bandgap is indicated on the diagram, the refractive index is expected to vary monotonically with the bandgap. It should be understood that the semiconductor layers in the output mirror 14 and active region 26 can be P- or N-doped, depending upon the type of laser device.

In FIG. 6, the input mirror 40 is made of three dielectric layers 42, 44, 46 and one metallalic layer 48. The input mirror 40 shown contains one set of dielectric layers. Any number of sets of dielectric layers can be included in an input mirror below the metallic layer. Thus, for example, the input mirror could contain two sets of dielectric layers, with a total of six layers, and one metallic layer. It should be understood that increasing the number of sets of dielectric layers results in higher reflectivity but less electron transmission. Thus, in a preferred embodiment, the input mirror contains one or two sets of dielectric layers.

In FIG. 6, dielectric layer 44 is made of a material that has substantially different refractive indices from that of its adjacent layers 42, 46. The dielectric layers can be made of semiconductor or other materials that exhibit high optical reflectivity and substantial electron transparency at the kinetic energy of the electrons in the e-beam 50. In a preferred embodiment, the dielectric layer 44 consists essentially of $SiO_2$ and its adjacent layers 42, 46 consists essentially of $TiO_2$, or vice versa.

The metallic layer 48 is made of a metallic material that has a high reflectivity at the optical wavelength of the emitted light 44. Preferably, the metallic material also has low density and electron transparency. Thus, the metallic material can be, for example, silver, aluminum or gold. In a preferred embodiment, the matallic material is silver or aluminum.

In FIG. 1, where an e-beam 50 is used to pump the structure 10, it is preferred that the input mirror 40 be very thin. Thus, the dielectric layers preferably have a thickness of a quarter of a wavelength. The term "quarter of a wavelength" denotes the thickness value obtained from the formula I:

$$\frac{1}{4}(Lambda) \div index \qquad (I)$$

wherein "Lambda" is the optical wavelength of the emitted light, and "index" is the refractive index of the dielectric material. It is especially preferred to sputter deposit the dielectric layers. The thickness of the metallic layer 48 is preferably between about 500 to about 1,000 Å. It is understood that the thicker the metallic layer 48, the more the amount of electrons absorbed by the metallic material. Where other methods of light emission such as electrical injection are used, the requirement of a thin input mirror is not as critical.

It should be understood that the thickness of the layers and the number of layers in the output mirror 14, the active region 26 and the input mirror 40 are design parameter which depend upon the operating wavelength(s) of the light-emitting device.

The present invention also relates to a method of making an epitaxial structure suitable as a target in a light-emitting device operation in the visible wavelength region. In accordance with the present invention, semiconductor layers in the output mirror 14 and the active region 26 can be provided by conventional methods which allow control of the composition and thickness of the semiconductor layers. Thus, for example, conventional epitaxial growth processes can be used to manufacture the epitaxial structure 10 of the present invention. A preferred process is a vapor-phase epitaxial deposition method. For example, the epitaxial structure 10 can be provided by molecular beam epitaxy (MBE), gas-source molecular beam epitaxy (GSMBE), metalorganic molecular beam epitaxy (MOMBE), chemical beam epitaxy (CBE), and metalorganic chemical vapor deposition (MOCVD), the latter process also known as metalorganic vapor phase epitaxy (MOVPE). The most preferred processes are MBE and MOMBE.

In a preferred embodiment of the present invention, the substrate 12 is mechanically polished to an optical quality finish ("optical polish"). When the substrate 12 is made of $MF_2$, wherein M is Sr, Pb, Ca or Ba, it is more preferred that the optically polished substrate is subsequently treated to reduce the polishing damage and significantly improve the morphology of the highly polar $MF_2$ surface without inducing facetting.

The treatment process involves exposing the optically polished substrate to a flowing ambient of reactive HF in He (HF/He atmosphere) at an elevated temperature. In a particularly preferred embodiment, the substrate is placed in a vacuum chamber containing a flowing HF/He atmosphere. The gas composition of the HF/He atmosphere is between about 1 to about 100 mole % anhydrous HF in He. The substrate in the HF/He atmosphere is then heated at a rate that avoids thermally shocking and cracking the substrate, for example, between 0.3° and about 1.5° C. per minute, until a final anneal temperature that is greater than about 300° and below either 1400° C. or the melting temperature of the substrate, whichever is less, is reached. For example, the preferred final annealing temperature for a substrate made of $SrF_2$ is between about 500° to about 1100° C. The more preferred annealing temperature for $SrF_2$ substrate is between about 550° to about 900° C. The substrate is maintained at the final annealing temperature for a selected amount of anneal time and then cooled to room temperature at a rate that avoids thermally shocking and cracking the substrate, for example, between about 0.3° and about 1.5° C. per minute. The amount of anneal time predominantly depends upon the type of substrate and the composition of the HF/He atmosphere. This annealing process provides surfaces with markedly improved morphology and order as determined by Nomarski optical contrast spectroscopy, and reflection high-energy electron diffraction (RHEED). While not wishing to be bound by theory, the mechanism by which the fluoride substrates are smoothed in this procedure appears to be a combination of evaporation under anhydrous conditions and reaction of the HF with the fluoride surface to form volatile hydrofluorides. See Ikrami et al., *Russ. J. Inorg. Chem.*, vol. 16, p. 1656 (1971).

The advantages and other characteristics of the present invention are best illustrated by the following examples.

EXAMPLES 1-3

In Examples 1-3, the substrates undergoes (1) a mechanical polishing process, and (2) a treatment process as described below.

Mechanical Polishing of Substrate

Substrates made of (001) $SrF_2$ were obtained from single crystal bulk fluoride boules grown by the Bridgeman technique in flowing mixture within the range of 1–20% anhydrous HF in helium. Bulk $SrF_2$ boules were oriented to ±0.5° by Laue backscattering x-ray spectroscopy and subsequently sliced into wafers of approximately 0.1 cm thickness. These wafers were mechanically polished to an optical finish using 0.3 μm $Al_2O_3$ in ethylene glycol and finally cut into 1 cm² substrates.

Treatment of Substrate Surface

The mechanically polished substrates were then solvent degreased and placed in a vitreous carbon crucible where they were suspended in a specially fabricated Ta wire frame which allowed circulation of the HF/He atmosphere above and below each substrate. The crucible was placed in a crystal growth furnace (Astro Industries Inc.) equipped with HF flow facility and capable of attaining temperatures as high as 2000° C.

Following installation of the substrates the crystal growth furnace was evacuated for a period of no less than 24 hours. At this time a flow (0.75–1.45 liters/min) of approximately 10 mole % anhydrous HF/He was initiated and a slow ramp of 1.5° C./min was used to raise the substrates to the final anneal temperature. This final anneal temperature, as well as the anneal time, were varied to establish the optimum process window. At the completion of the selected anneal time, the substrates were cooled to room temperature at the same rate of 1.5° C./min.

Three (001) $SrF_2$ substrates polished to an optical quality were annealed at the final anneal temperature for the corresponding amount of anneal time shown in Table I in order to determine the optimum annealing conditions. No distinct RHEED patterns were observed in the optically polished substrates, as received. Only a diffuse background were observed in the pre-annealed substrates.

TABLE I

| | Annealing Conditions | |
|---|---|---|
| Example | Final Anneal Temperature (°C) | Anneal Time (hours) |
| 1 | 600 | 30 |
| 2 | 800 | 15 |
| 3 | 1000 | 15 |

For all three examples, RHEED patterns were clearly observed in the annealed substrates and no evidence of facetting were observed in the diffraction pattern. Residual damage that was observable in the substrate at 600° C. was observed to be substantially reduced in the substrate at 800° C. The substrate annealed at 1000° C. was observed to have a markedly different morphology, although it was not facetted as observed by RHEED.

These results suggest that the optimum conditions for (001) $SrF_2$ substrate preparation lie within the process conditions of the substrates treated in Examples 1 and 2, as indicated in Table I above.

At a final anneal temperature of 600° C., an upper limit to the weight loss from a 1 cm² (001) $SrF_2$ substrate from evaporation alone is estimated to be on the order of a few percent of a monolayer. The estimation performed used weight loss associated with a Langumuir method for vapor pressure determination and assumed a vaporization coefficient of 1. Nevertheless, treatment of the (001) $SrF_2$ substrates under these conditions resulted in surfaces with distinct RHEED patterns, suggesting that an additional reaction was occurring to smooth the surface.

EXAMPLES 4–6

The material system containing different layers of the $Zn_{1-x-y}Cd_xMg_ySe$ alloy system was grown on $SrF_2$ to provide blue and green emission. The same alloy system could be grown lattice-matched to $PbF_2$ for red emission.

Specifically, compositions of (001) ZnCdSe alloys listed in Table A below, which span the region above and below the lattice constant of $SrF_2$ (5.800 Å), as shown in Table II, were grown on (001) $SrF_2$ substrates which were treated as described in Examples 1–3.

TABLE II

| | $Zn_{1-x}Cd_xSe$ Compositions | |
|---|---|---|
| Sample | Ref. no. | Nominal Composition (x) |
| X | 54 | 47% |
| Y | 56 | 30% |
| Z | 58 | 15% |

The $SrF_2$ substrates were mounted with In onto a low resistivity (p=1×10¹⁸)Si doped GaAs double side polished 2" wafer which was in turn mounted in an In free Mo substrate holder and transferred into vacuum. This mounting technique was determined to provide an effective and reliable heating of the transparent (11 Ev bandgap) $SrF_2$ substrates as determined by temperature calibration performed using reflection bandgap spectroscopy on semi-insulating GaAs test wafers mounted in an identical fashion.

A 1000 Å buffer layer of $SrF_2$ was subsequently deposited on these substrates in a deposition chamber (separate from the II–VI deposition chamber but connected to it via an ultrahigh vacuum transfer vessel) from a solid source effusion cell of high purity $SrF_2$ held at 1300° C. The temperature of the $SrF_2$ buffer layer deposition ranged from 350° C. to 500° C. and the deposition rate was 0.1 μm/hr. Substrates were ramped up and down to and from the deposition temperature with a programmed temperature ramp of 1.6° C./sec. RHEED measurements clearly indicate that the buffer layers deposited on the $SrF_2$ substrates were epitaxial while $SrF_2$ deposited on the GaAs mounting wafer (oxide not desorbed) was polycrystalline.

Figure 3:
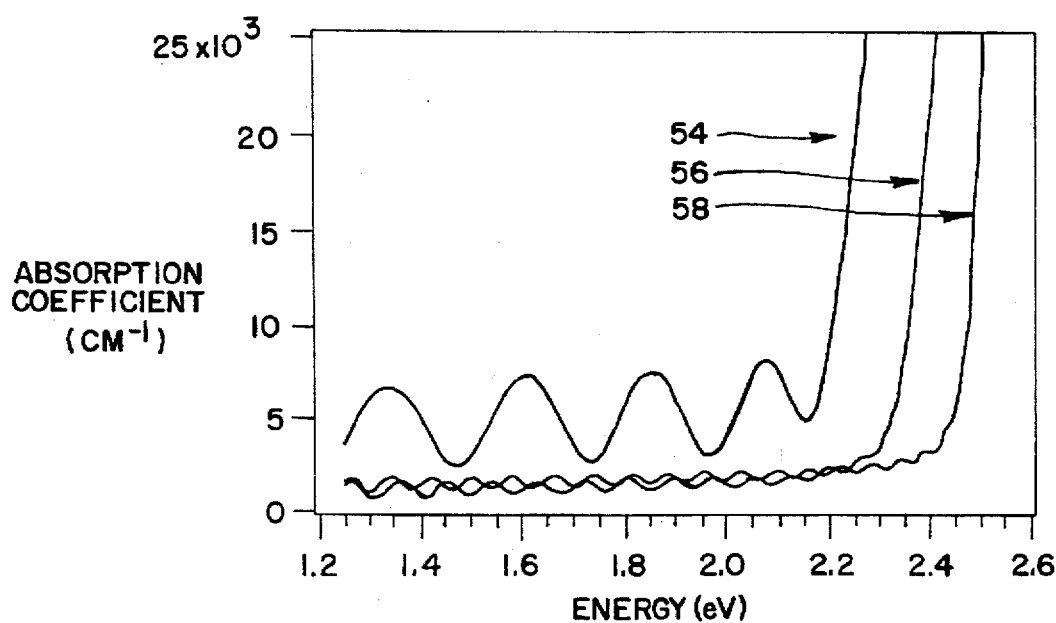
FIG. 3 is a plot of absorption coefficient (uncorrected for reflectivity for three different alloy compositions of ZnCdSe grown on (001) $SrF_2$.

The (001) ZnCdSe alloys listed in FIG. 3 were grown in a custom MOMBE chamber using the commercially available metalorganic precursors diethylzinc, dimethylcadmium, and diethylselenium which were precracked at temperatures of 800° C., 866° C., and 900° C. respectively. All the ZnCdSe layers were grown at a substrate temperature of 250° C. Substrates were ramped up and down to and from the deposition temperature with a programmed temperature ramp of 1.6° C./sec. Layers were grown to a thickness from 1–3 μm as determined by in situ multiwavelength time-resolved reflectivity and ex situ transmission spectra. Relative thicknesses for the three samples X 54, Y 56 and Z 58 are 1, 3 and 3 microns respectively. Near stoichiometric growth conditions were selected, although both Group II and Group VI dependent growth regimes were sampled, as determined by the dependence of alloy composition of Group VI flux. The layer quality was not a strong function of the II/VI ratio under the conditions studied.

All the layers were epitaxial, had sharp transmission onsets, and exhibited band-edge photoluminescence. Epilayers having a thickness of 3 μm and Zn contents as large as 75% showed no evidence of cracking when cooled from the growth temperature, even though these epilayers experienced considerable tensile strain.

FIG. 3 shows transmission spectra for samples X 54, Y 56, and Z 58. Of note is the sharpness of the transmission cutoff and the confirmation of substrate transparency in the visible.

Figure 4:
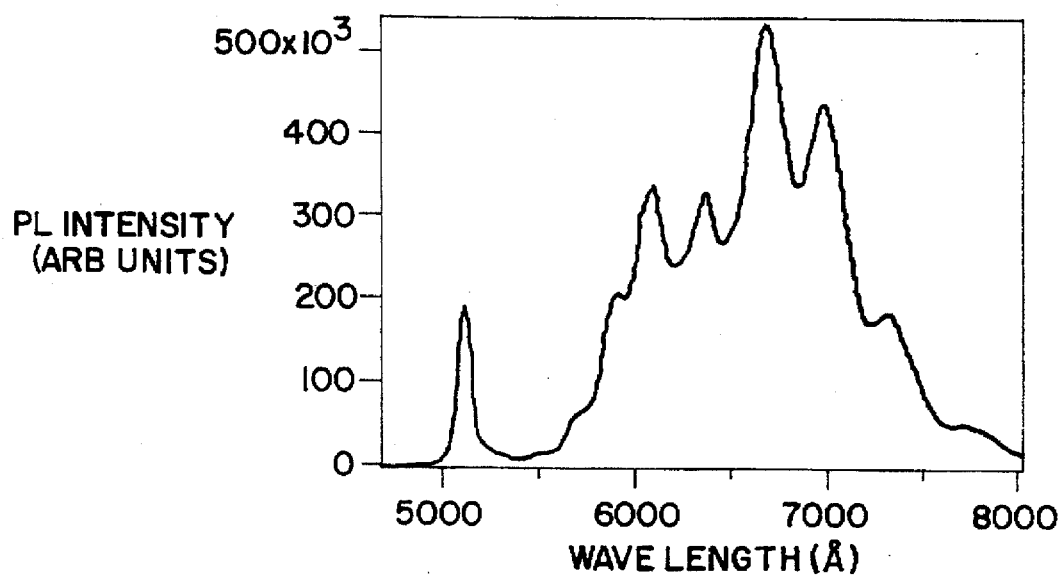
FIG. 4 shows the photoluminescence spectrum of the second sample alloy composition of (001) $ZnCdSe/SrF_2$ at 77K and 300 $mW/cm^2$.

FIG. 4 shows the photoluminescence spectra of sample Y 56 exhibiting band-edge luminescence typical of these layers. In FIG. 4, a substantial defect band is apparent, which illustrates that further optimization of the growth conditions and in particular of the nucleation step is necessary.

Figure 5:
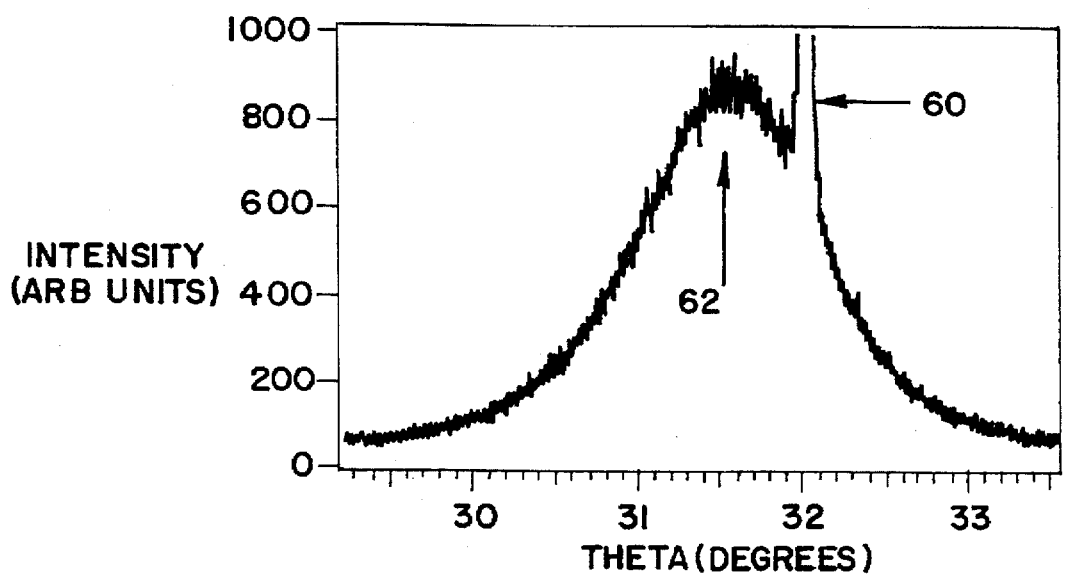
FIG. 5 shows a X-ray rocking curve measurement of the second alloy composition of (001) $ZnCdSe/SrF_2$.

FIG. 5 is an x-ray rocking curve of sample Y 54 showing that the material is indeed epitaxial. Peak 60 denotes that of (001) SrF$_2$, and peak 62 denotes that of (001) ZnCdSe. In FIG. 5, the x-ray full width at half maximum intensity is broad, typical of epitaxy of dissimilar materials, and again highlights a refinement required in the growth conditions. Nevertheless, even without fine tuning of the parameters, it is clear that heteroepitaxy of II–VI materials on fluoride substrates is achievable for the ultimate application to visible and ultraviolet optical devices.

The above examples demonstrate that wide band gap II–VI alloys can successfully be grown on fluoride substrates epitaxially and without evidence of deleterious interfacial reactions, that the substrates exhibit transparency suitable for optical devices operating in the visible wavelength range, and that with proper optimization this approach can be used to fabricate a new class of devices based on these material systems.

This invention allows epitaxial deposition technology to be used to precisely tailor the properties of the optical emitter. Thickness can be much more precisely controlled, particularly at thickness values required to allow practical acceleration voltages to be used (implementations using thinned bulk crystals require 75 kV acceleration voltages, while this invention allows designs optimized for 20 kV or less).

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. An epitaxial system suitable for use in a light-emitting device having at least one operating frequency in the visible range comprising:

a semiconductor substrate that is transparent at the operating frequency;

an output mirror comprising at least one pair of adjacent semiconductor layers wherein a first semiconductor layer having a first refractive index and a first wide bandgap, a second semiconductor layer having a second wide bandgap and a second refractive index substantially different from said first refractive index;

an active region comprising at least one active layer, said active layer having a bandgap narrower than the first wide bandgap and the second wide bandgap;

wherein said active region and said output mirror are substantially lattice matched to said substrate.

2. The epitaxial system of claim 1 wherein said substrate is transparent at the wavelength of blue light.

3. The epitaxial system of claim 1 wherein:

said substrate consists essentially of a fluoride material selected from the group consisting of strontium fluoride and lead fluoride;

said output mirror comprising II–VI materials;

said active region comprising II–VI materials.

4. The epitaxial system of claim 1 wherein said active region comprises a first cladding layer, a second cladding layer and at least one quantum well between said first and second cladding layers.

5. A semiconductor target suitable for a device emitting a light beam having an optical wavelength within the visible range consisting essentially of:

a semiconductor substrate that is transparent at the optical wavelength;

an output mirror comprising at least one pair of adjacent semiconductor layers wherein a first semiconductor layer having a first refractive index and a first wide bandgap, a second semiconductor layer having a second wide bandgap and a second refractive index substantially different from said first refractive index;

an active region comprising at least one active layer, said active layer having a bandgap narrower than the first wide bandgap and the second wide bandgap;

an input mirror;

wherein said active region and said output mirror are substantially lattice matched to said substrate.

6. The semiconductor target of claim 5 wherein said input mirror comprises a semiconductor material.

7. The semiconductor target of claim 5 wherein:

said substrate includes MF$_2$, where M is selected from the group consisting of strontium, lead, barium and calcium;

said output mirror comprises a semiconductor material selected from the group consisting of II–VI and III–V materials;

said active region comprises a semiconductor material selected from the group consisting of II–VI and III–V materials.

8. The semiconductor target of claim 5 wherein said active region comprises a first cladding layer, a second cladding layer and a quantum well between said first and second cladding layers.

9. A method for making an epitaxial system suitable for use in a device for emitting at least one light beam having an optical wavelength within the visible range, the steps comprising:

providing a semiconductor substrate that is transparent at the optical wavelength;

providing an output mirror over said substrate, said output mirror comprising at least one pair of adjacent semiconductor layers wherein a first semiconductor layer having a first refractive index and a first wide bandgap, a second semiconductor layer having a second wide bandgap and a second refractive index substantially different from said first refractive index;

providing an active region including at least one active layers over said output mirror, said active layer having a bandgap narrower than the first wide bandgap and the second wide bandgap;

wherein said active region and said output mirror are substantially lattice matched to said substrate.

10. The method of claim 9 wherein:

said output mirror is provided over said substrate by a vapor-phase deposition method;

said active region are provided over said output mirror by the vapor-phase deposition method.

11. The method of claim 9 further comprising the step of providing an input mirror over said active region.

12. The method of claim 11 wherein said input mirror comprises a semiconductor material.

13. The method of claim 11 further comprising the step of providing a buffer layer between said substrate and said output mirror.

14. A method for making a semiconductor target suitable for a device for emitting at least one light beam having an optical wavelength within the visible range, the steps comprising:

providing a semiconductor substrate which is transparent at the optical wavelength, said substrate including $MF_2$, where M is selected from the group consisting of strontium, lead, barium and calcium;

annealing said substrate in a reactive HF/He atmosphere at a final anneal temperature that is greater than about 300° and less than about 1400° C. or the melting point of the substrate, whichever is less;

providing an output mirror over said substrate, said output mirror comprising at least one pair of adjacent semiconductor layers wherein a first semiconductor layer having a first refractive index and a first wide bandgap, a second semiconductor layer having a second wide bandgap and a second refractive index substantially different from said first refractive index;

providing an active region including at least one active layers over said output mirror, said active layer having a bandgap narrower than the first wide bandgap and the second wide bandgap;

wherein said active region and said output mirror are substantially lattice matched to said substrate.

15. The method of claim 14 wherein the reactive HF/He atmosphere has a gas composition between about 1 and about 20 mole % anhydrous HF in He.

16. A method for reducing roughness of a semiconductor substrate surface, comprising the steps of:

providing a substrate including $MF_2$, where M is selected from the group consisting of strontium, lead, barium and calcium;

annealing said substrate in a reactive HF/He atmosphere at a final anneal temperature that is greater than about 300° and less than about 1400° C. or the melting point of the substrate, whichever is less.

17. The method of claim 16 further comprising the step of mechanically polishing said substrate prior to annealing.

18. The method of claim 16 where said reactive atmosphere has a gas composition of between about 1 to about 100 mole % anhydrous HF in He.

19. The method of claim 16 wherein said annealing step includes heating said substrate at a rate that avoids thermally shocking and cracking said substrate, until said final annealing temperature is reached.

20. The method of claim 16 further comprising the step of cooling said annealed substrate to room temperature at a rate that avoids thermally shocking and cracking said substrate.

* * * * *